(12) United States Patent
Shi

(10) Patent No.: US 9,798,208 B2
(45) Date of Patent: Oct. 24, 2017

(54) TFT SUBSTRATE, TFT SWITCH AND MANUFACTURING METHOD FOR THE SAME

(71) Applicant: Shenzhen China Star Optoelectronics Technology Co., Ltd., Shenzhen, Guangdong (CN)

(72) Inventor: Longqiang Shi, Guangdong (CN)

(73) Assignee: Shenzhen China Star Optoelectronics Technology Co., Ltd., Shenzhen, Guangdong (CN)

(*) Notice: Subject to any disclaimer, the term of this patent is extended or adjusted under 35 U.S.C. 154(b) by 128 days.

(21) Appl. No.: 14/889,533

(22) PCT Filed: Oct. 8, 2015

(86) PCT No.: PCT/CN2015/091442
§ 371 (c)(1),
(2) Date: Nov. 6, 2015

(87) PCT Pub. No.: WO2017/054252
PCT Pub. Date: Apr. 6, 2017

(65) Prior Publication Data
US 2017/0184890 A1 Jun. 29, 2017

(51) Int. Cl.
*G02F 1/1368* (2006.01)
*G02F 1/1362* (2006.01)
*H01L 29/786* (2006.01)
*H01L 29/423* (2006.01)
*H01L 21/477* (2006.01)

(52) U.S. Cl.
CPC ...... *G02F 1/1368* (2013.01); *G02F 1/136209* (2013.01); *G02F 2001/136218* (2013.01); *G02F 2201/122* (2013.01); *G02F 2202/10* (2013.01); *H01L 21/477* (2013.01); *H01L 29/42384* (2013.01); *H01L 29/7869* (2013.01); *H01L 29/78618* (2013.01)

(58) Field of Classification Search
CPC ............. H01L 21/0273; H01L 21/0274; H01L 21/31138; H01L 21/32134; H01L 29/4908; H01L 29/78669; H01L 29/78678
See application file for complete search history.

(56) References Cited

U.S. PATENT DOCUMENTS

2012/0074418 A1* 3/2012 Yamazaki ........... H01L 27/1214
257/66
2016/0056184 A1* 2/2016 Wei ..................... H01L 27/1255
257/43

* cited by examiner

*Primary Examiner* — Evan Pert
*Assistant Examiner* — Changhyun Yi
(74) *Attorney, Agent, or Firm* — Andrew C. Cheng

(57) ABSTRACT

A TFT substrate, a TFT switch and a manufacturing method for the same are disclosed. The method includes steps of disposing a gate electrode layer on a substrate, thinning at least a portion of each side region along a thickness direction of the gate electrode layer in order to form two thin regions, disposing a semiconductor layer above the gate electrode layer, and disposing a source electrode layer and a drain electrode layer on the semiconductor layer, wherein, a contact region between the source electrode layer and the semiconductor layer, and a contact region between the drain electrode layer and the semiconductor layer are respectively corresponding to the two thin regions. The present invention can omit a doping process in order to achieve a good ohmic contact so as to solve a schottky contact problem.

12 Claims, 3 Drawing Sheets

TFT SUBSTRATE, TFT SWITCH AND MANUFACTURING METHOD FOR THE SAME

BACKGROUND OF THE INVENTION

1. Field of the Invention

The present invention relates to a display technology field, and more particularly to a TFT substrate, a TFT switch and a manufacturing method for the same.

2. Description of Related Art

A thin-film-transistor (TFT) based on oxide semiconductor is a hot research point for a further display field, and is widely studied and researched in the recent years. Wherein, an amorphous indium gallium zinc oxide (a-IGZO) compound thin film functions as an active channel layer has a high mobility up to 80 cm2/Vs (a mobility of an amorphous silicon only 0.5~0.8 cm2/ Vs). Besides, the a-IGZO thin film is compatible with large-scaled a-Si mass production processes. Thus, the IGZO thin film has a great application future in a next generation LCD and organic light emitting diode (OLED).

However, a schottky contact is formed when a metal is contacted with the IGZO thin film. At a contact interface, the semiconductor band is bended so as to form a barrier. The existence of the barrier results in a large interface resistance, that is, a schottky resistance. The schottky resistance cause an insufficient on-state current of a TFT device, too large subthreshold swing (SS), and decreasing a stability of the device such that a display quality is affected.

Accordingly, decreasing the contact resistance between the metal and the IGZO thin film in order to form an ohmic contact is an important factor for deciding the performance of a semiconductor device. In the conventional art, one way to form the ohmic contact is performing a heavy doping (n+IGZO) at a semiconductor region contacted with the metal such that a depletion region of the interface becomes narrow, and electrons have more opportunities to pass through directly (tunneling effect). However, the conventional art for forming the ohmic contact requires an additional doping process so as to increase the manufacturing cost.

SUMMARY OF THE INVENTION

The main technology problem solved by the present invention is to provide a TFT substrate, a TFT switch and a manufacturing method for the same, which can omit a doping process in order to achieve a good ohmic contact so as to solve a schottky contact problem.

In order to solve the above technology problem, a technology solution utilized by the present invention is: a manufacturing method for a thin-film-transistor (TFT) switch, comprising steps of: providing a substrate; disposing a gate electrode layer on the substrate, wherein, the gate electrode layer includes a middle region and side regions respectively located at two sides of the middle region; thinning at least a portion of each side region along a thickness direction of the gate electrode layer in order to form two thin regions, a thickness of each thin region is less than a thickness of the middle region; disposing a semiconductor layer above the gate electrode layer; and disposing a source electrode layer and a drain electrode layer on the semiconductor layer, wherein, a contact region between the source electrode layer and the semiconductor layer, and a contact region between the drain electrode layer and the semiconductor layer are respectively corresponding to the two thin regions such that lights of a backlight source can irradiate the semiconductor layer after passing through the thin regions so that an ohmic contact is formed between the semiconductor layer and the source electrode layer and between the semiconductor layer and the drain electrode layer.

Wherein, before the step of disposing a semiconductor layer above the gate electrode layer, further includes a step of disposing a gate insulation layer on the gate electrode layer.

Wherein, the step of disposing a gate electrode layer on the substrate further includes: disposing a metal layer on the substrate through a physical vapor deposition method; and performing a lithography process, an etching process and a film removing process in order to form the gate electrode layer.

Wherein, the step of thinning at least a portion of each side region along a thickness direction of the gate electrode layer in order to form two thin regions further includes: performing a lithography process, an etching process and a film removing process in order to form the thin regions.

Wherein, a material of the semiconductor layer is an indium gallium zinc oxide compound; and the step of disposing a semiconductor layer above the gate electrode layer further includes: disposing an indium gallium zinc oxide compound layer on the gate insulation layer through a physical vapor deposition (PVD) method; and performing a lithography process, an etching process and a film removing process in order to form the semiconductor layer, wherein, the semiconductor layer is disposed corresponding to the thin regions and the middle region.

Wherein, the step of disposing a source electrode layer and a drain electrode layer on the semiconductor layer further includes: disposing a metal layer on the semiconductor layer through a physical vapor deposition method; and performing a lithography process, an etching process and a film removing process in order to form the source electrode layer and the drain electrode layer, wherein, a contact region between the source electrode layer and the semiconductor layer and a contact region between the drain electrode layer and the semiconductor layer are respectively corresponding to the two thin regions.

In order to solve the above technology problem, another technology solution adopted by the present invention is: a thin-film-transistor (TFT) switch, comprising: a substrate; a gate electrode layer disposed on the substrate, wherein, the gate electrode layer includes a middle region and side regions respectively located at two sides of the middle region, wherein at least a portion of each side region is thinned along a thickness direction of the gate electrode layer in order to form two thin regions, and a thickness of each thin region is less than a thickness of the middle region; a semiconductor layer disposed above the gate electrode layer; and a source electrode layer and a drain electrode layer disposed on the semiconductor layer, wherein, a contact region between the source electrode layer and the semiconductor layer, and a contact region between the drain electrode layer and the semiconductor layer are respectively corresponding to the two thin regions such that lights of a backlight source can irradiate the semiconductor layer after passing through the thin regions so that an ohmic contact is formed between the semiconductor layer and the source electrode layer and between the semiconductor layer and the drain electrode layer.

Wherein, the TFT switch further includes: a gate insulation layer disposed between the gate electrode layer and the semiconductor layer.

Wherein, a material of the semiconductor layer is an indium gallium zinc oxide compound.

In order to solve the above technology problem, another technology solution utilized by the present invention is: a thin-film-transistor (TFT) substrate, wherein the TFT substrate includes a TFT switch, and the TFT switch includes: a substrate; a gate electrode layer disposed on the substrate, wherein, the gate electrode layer includes a middle region and side regions respectively located at two sides of the middle region, wherein at least a portion of each side region is thinned along a thickness direction of the gate electrode layer in order to form two thin regions, and a thickness of each thin region is less than a thickness of the middle region; a semiconductor layer disposed above the gate electrode layer; and a source electrode layer and a drain electrode layer disposed on the semiconductor layer, wherein, a contact region between the source electrode layer and the semiconductor layer, and a contact region between the drain electrode layer and the semiconductor layer are respectively corresponding to the two thin regions such that lights of a backlight source can irradiate the semiconductor layer after passing through the thin regions so that an ohmic contact is formed between the semiconductor layer and the source electrode layer and between the semiconductor layer and the drain electrode layer.

Wherein, the TFT switch further includes: a gate insulation layer disposed between the gate electrode layer and the semiconductor layer.

Wherein, a material of the semiconductor layer is an indium gallium zinc oxide compound.

The beneficial effect of the present invention is: comparing with the conventional art, the manufacturing method of the TFT switch of the present invention is: first of all, providing a substrate; then, disposing a gate electrode layer on the substrate, wherein, the gate electrode layer includes a middle region and side regions respectively located at two sides of the middle region; thinning at least a portion of each side region along a thickness direction of the gate electrode layer in order to form two thin regions, a thickness of each thin region is less than a thickness of the middle region; disposing a semiconductor layer above the gate electrode layer; and finally, disposing a source electrode layer and a drain electrode layer on the semiconductor layer, wherein, a contact region between the source electrode layer and the semiconductor layer, and a contact region between the drain electrode layer and the semiconductor layer are respectively corresponding to the two thin regions such that lights of a backlight source can irradiate the semiconductor layer after passing through the thin regions so that an ohmic contact is formed between the semiconductor layer and the source electrode layer and between the semiconductor layer and the drain electrode layer. Therefore, in the present embodiment, a doping region can be formed through a light irradiation process in the manufacturing process. No additional doping process is required in order to save the manufacturing cost. Furthermore, the present embodiment can achieve a good ohmic contact in order to solve the schottky contact problem.

DETAILED DESCRIPTION OF THE PREFERRED EMBODIMENT

Figure 1:
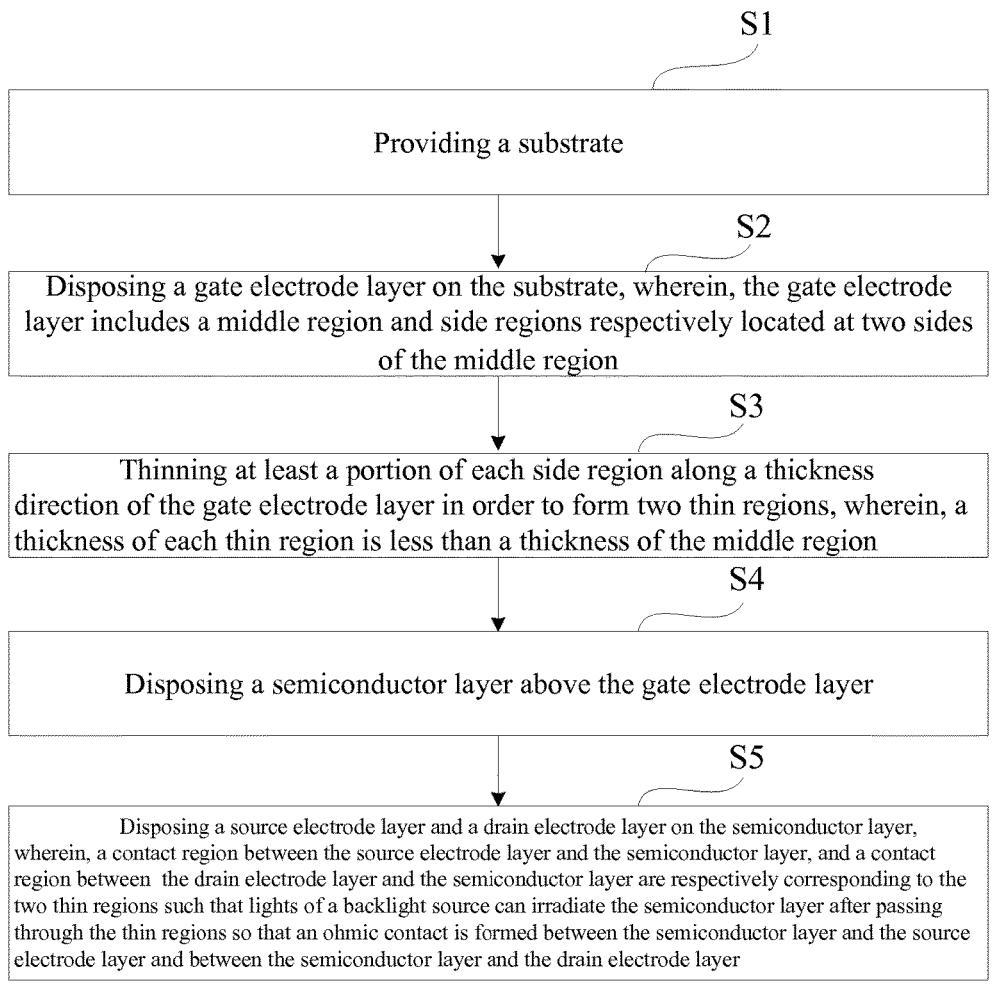
FIG. 1 is a flowchart of a manufacturing method for a TFT switch according to an embodiment of the present invention.
Figure 2:
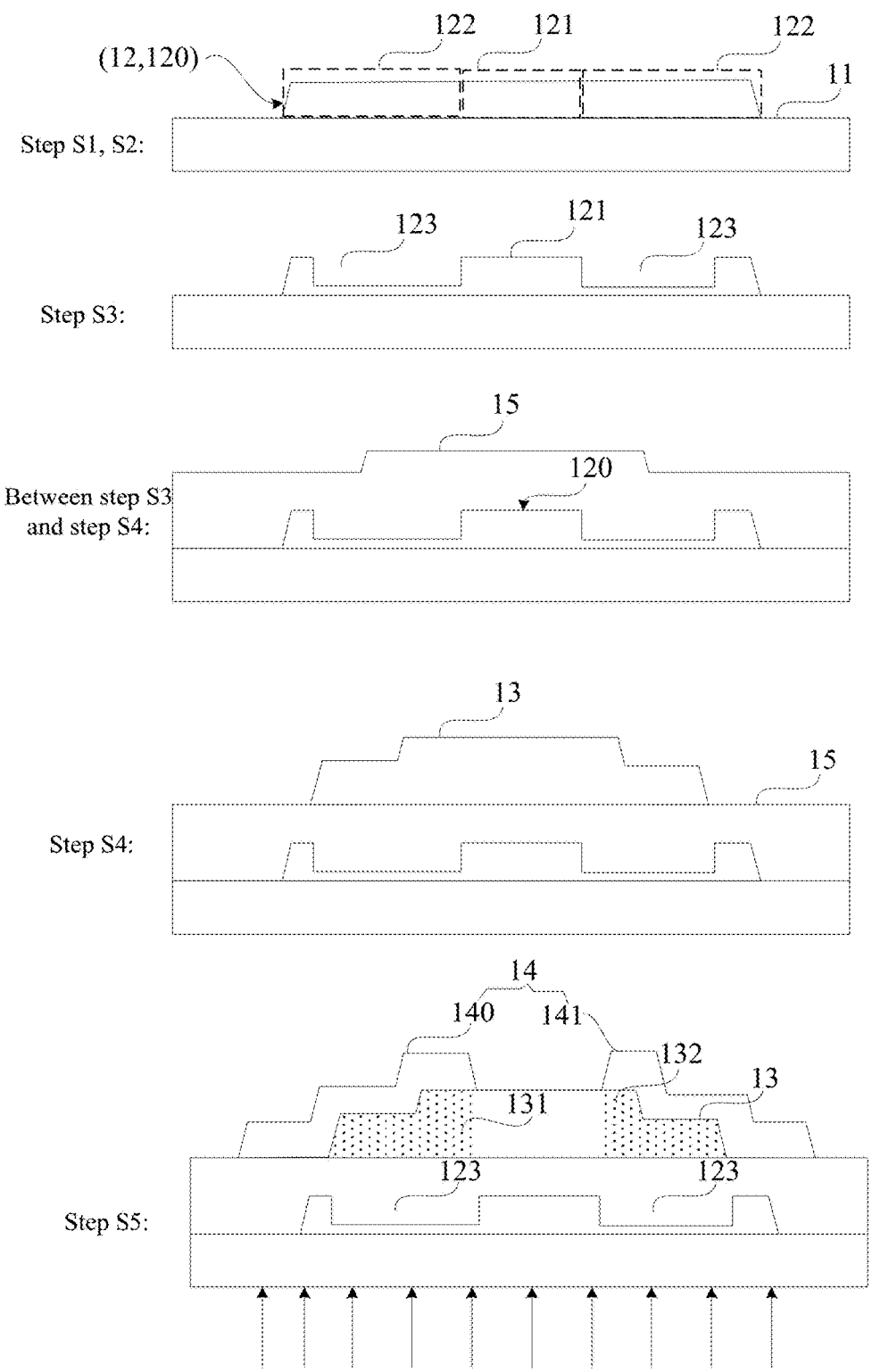
FIG. 2 is a manufacturing process diagram corresponding to the flowchart shown in FIG. 1.

With reference to FIG. 1 and FIG. 2, FIG. 1 is a flowchart of a manufacturing method for a TFT switch according to an embodiment of the present invention and FIG. 2 is a manufacturing process diagram corresponding to the flowchart shown in FIG. 1. As shown in FIG. 1 and FIG. 2, the method of the present embodiment includes following steps:

Step S1: providing a substrate 11.

In the present step: the substrate 11 is preferably a glass substrate, and simultaneously cleaning and drying the substrate 11 when providing the substrate 11 in order to provide a clean glass substrate.

Step S2: disposing a gate electrode layer 120 on the substrate 11. Wherein, the gate electrode layer 120 includes a middle region 121 and side regions 122 respectively located at two sides of the middle region 121.

The present step specifically is: firstly, disposing a metal layer 12 on the substrate 11 through a physical vapor deposition method. Then, performing a lithography process, an etching process and a film removing process in order to form the gate electrode layer 120.

Wherein, the etching process of the present step is preferably a wet etching process. Ammonium persulfate, sulfuric acid/chromic acid, sulfuric acid or hydrogen peroxide can be selected as an etching solution. Because the cost of the etching solution is low, the wet etching process of the present step can reduce the etching cost.

Step S3: thinning at least a portion of each side region 122 along a thickness direction of the gate electrode layer 120 in order to form two thin regions 123. A thickness of each thin region 123 is less than a thickness of the middle region 121. Optionally, a ratio of the thickness of the thin region 123 to the thickness of the middle region 121 is 1:100.

In the present step, specifically, performing a lithography process, an etching process and a film (a photoresist film) removing process in order to form the thin region 123.

Wherein, in the present step, the etching process is preferably a dry etching process. Specifically, using an etching gas under an acceleration of an electric field to form an active radical of a plasma body, and chemically reacts with the material under etching to form volatile substances and take away by airflow. Wherein, the etching gas includes fluorocarbons or fluorinated hydrocarbons, and so on. Because the drying etching can precisely control an etching pattern through controlling an electric field, the dry etching utilized by the present step can increase an etching precision.

Step S4: disposing a semiconductor layer 13 above the gate electrode layer 120.

Before the present step, further comprising a step of disposing a gate insulation layer 15 on the gate electrode layer 120.

Wherein, a material of the semiconductor layer 13 is preferably an indium gallium zinc oxide compound. The present step specifically is: disposing an indium gallium zinc oxide compound layer on the gate insulation layer 15 through a physical vapor deposition (PVD) method. Then, performing a lithography process, an etching process and a film (a photoresist film) removing process in order to form the semiconductor layer 13. The semiconductor layer 13 is disposed corresponding to the thin regions 123 and the middle region 121.

Wherein, the etching process of the present step is a wet etching. The selection of the etching solution is described above, no more repeating.

Step S5: disposing a source electrode layer 140 and a drain electrode layer 141 on the semiconductor layer 13. Wherein, a contact region between the source electrode layer 140 and the semiconductor layer 13, and a contact region between the drain electrode layer 141 and the semiconductor layer 13 are respectively corresponding to the two thin regions 123 such that lights of a backlight source can irradiate the semiconductor layer 13 after passing through the thin regions 123 so that an ohmic contact is formed between the semiconductor layer 13 and the source electrode layer 140 and between the semiconductor layer 13 and the drain electrode layer 141. As shown in FIG. 2, when after lights irradiate the semiconductor layer 13, charge carriers formed by the lights are generated so as to form doping regions (N+IGZO) 131 and 133. Accordingly, between the semiconductor layer 13 and the source electrode layer 140, and between the semiconductor layer 13 and the drain electrode layer 141, a good ohmic contact is existed in order to decrease the contact resistance.

In the present step, specifically, through the physical vapor deposition method to dispose a metal layer 14 on the semiconductor layer 13, then, performing a lithography process, an etching process and a film removing process in order to form the source electrode layer 140 and the drain electrode layer 141. The contact region between the source electrode layer 140 and the semiconductor layer 13, and the contact region between the drain electrode layer 141 and the semiconductor layer 13 are respectively corresponding to the two thin regions 123.

Wherein, the etching process of the present step is a wet etching. The selection of the etching solution is described above, no more repeating.

Therefore, in the present embodiment, a doping region can be formed through a light irradiation process in the manufacturing process. No additional doping process is required in order to save the manufacturing cost. Furthermore, the present embodiment can achieve a good ohmic contact in order to solve the schottky contact problem.

Furthermore, the present embodiment combines a dry etching method and a wet etching method in order to ensure an etching precision and to save the cost at the same time.

The present invention also provides a thin-film-transistor (TFT) switch. The TFT switch is manufactured through the manufacturing method described above. Specifically, with reference to FIG. 3, and FIG. 3 is a schematic structure diagram of a TFT switch according to an embodiment of the present invention.

Figure 3:
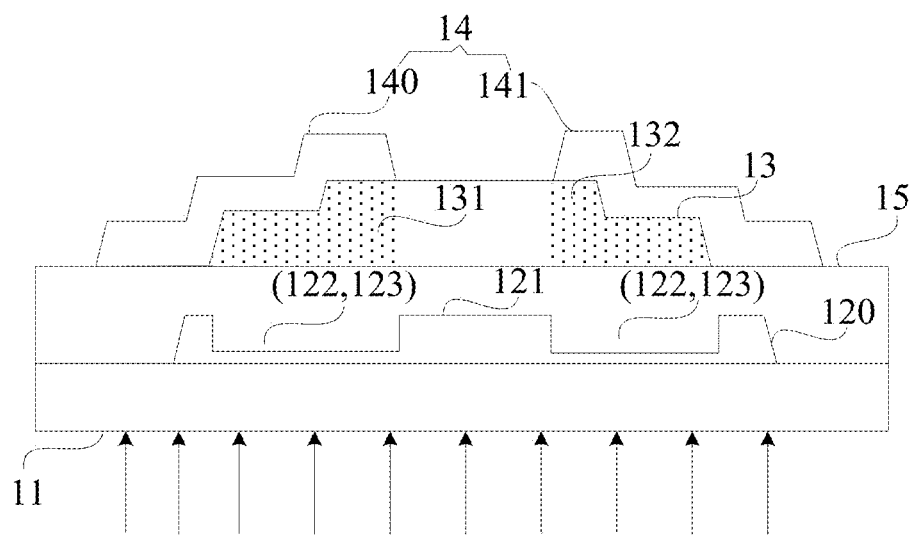
FIG. 3 is a schematic structure diagram of a TFT switch according to an embodiment of the present invention.

As shown in FIG. 3, a TFT switch 10 of the present embodiment includes a substrate 11, a gate electrode layer 120, a semiconductor layer 13, a source electrode layer 140 and a drain electrode layer 141.

Wherein, the gate electrode layer 120 is disposed on the substrate 11. Wherein, the gate electrode layer 120 includes a middle region 121 and side regions 122 respectively located at two sides of the middle region 121. At least a portion of each side region 122 is thinned along a thickness direction of the gate electrode layer 120 in order to form two thin regions 123. A thickness of each tin region 123 is less than a thickness of the middle region 121. Optionally, a ratio of the thickness of the thin region 123 to the thickness of the middle region 121 is 1:100.

The semiconductor layer 13 is disposed above the gate electrode layer 120. Furthermore, between the gate electrode layer 120 and the semiconductor layer 13, a gate insulation layer 15 is provided. In the present embodiment, a material of the semiconductor layer 13 is preferably an indium gallium zinc oxide compound.

The source electrode layer 140 and the drain electrode layer 141 are disposed on the semiconductor layer 13. Wherein, a contact region between the source electrode layer 140 and the semiconductor layer 13, and a contact region between the drain electrode layer 141 and the semiconductor layer 13 are corresponding to the two thin regions 123 such that lights of a backlight source can irradiate the semiconductor layer 13 after passing through the thin regions 123 so that an ohmic contact is formed between the semiconductor layer 13 and the source electrode layer 140 and between the semiconductor layer 13 and the drain electrode layer 141. As shown in FIG. 2, after lights irradiate the semiconductor layer 13, charge carriers formed by the lights are generated so as to form doping regions (N+IGZO) 131 and 133. Accordingly, between the semiconductor layer 13 and the source electrode layer 140, and between the semiconductor layer 13 and the drain electrode layer 141, a good ohmic contact is existed in order to decrease the contact resistance.

Figure 4:
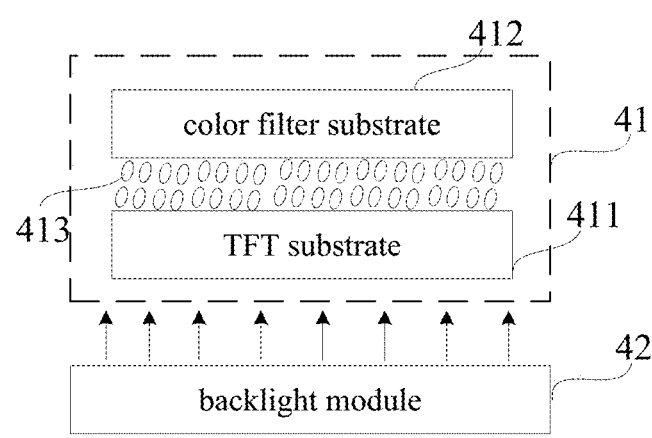
FIG. 4 is a schematic structure diagram of a liquid crystal display device according to an embodiment of the present invention.

The present embodiment also provides a liquid crystal display device. As shown in FIG. 4, the liquid crystal display device 40 includes a display panel 41 and a backlight module 42. The backlight module 42 provides a backlight source to the display panel 41. Wherein, the display panel 41 further includes a TFT substrate 411 and a color filter substrate 412 disposed oppositely, and a liquid crystal layer 413 disposed between the TFT substrate 411 and the color filter substrate 412. The TFT substrate 411 utilizes the TFT switch 10 described above.

Therefore, in the present embodiment, a doping region can be formed through a light irradiation process in the manufacturing process. No additional doping process is required in order to save the manufacturing cost. Furthermore, the present embodiment can achieve a good ohmic contact in order to solve the schottky contact problem.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A manufacturing method for a thin-film-transistor (TFT) switch, comprising steps of:
   providing a substrate;
   disposing a gate electrode layer on the substrate, wherein, the gate electrode layer includes a middle region and side regions respectively located at two sides of the middle region;
   thinning at least a portion of each side region along a thickness direction of the gate electrode layer in order to form two thin regions, a thickness of each thin region is less than a thickness of the middle region;
   disposing a semiconductor layer above the gate electrode layer; and
   disposing a source electrode layer and a drain electrode layer on the semiconductor layer, wherein, a contact region between the source electrode layer and the semiconductor layer, and a contact region between the drain electrode layer and the semiconductor layer are respectively corresponding to the two thin regions such that lights of a backlight source can irradiate the semiconductor layer after passing through the thin regions so that an ohmic contact is formed between the semiconductor layer and the source electrode layer and between the semiconductor layer and the drain electrode layer.

2. The method according to claim 1, wherein, before the step of disposing a semiconductor layer above the gate electrode layer, further includes a step of disposing a gate insulation layer on the gate electrode layer.

3. The method according to claim 1, wherein, the step of disposing a gate electrode layer on the substrate further includes:
   disposing a metal layer on the substrate through a physical vapor deposition method; and
   performing a lithography process, an etching process and a film removing process in order to form the gate electrode layer.

4. The method according to claim 1, wherein, the step of thinning at least a portion of each side region along a thickness direction of the gate electrode layer in order to form two thin regions further includes:
   performing a lithography process, an etching process and a film removing process in order to form the thin regions.

5. The method according to claim 2, wherein, a material of the semiconductor layer is an indium gallium zinc oxide compound; and
   the step of disposing a semiconductor layer above the gate electrode layer further includes:
   disposing an indium gallium zinc oxide compound layer on the gate insulation layer through a physical vapor deposition (PVD) method; and
   performing a lithography process, an etching process and a film removing process in order to form the semiconductor layer, wherein, the semiconductor layer is disposed corresponding to the thin regions and the middle region.

6. The method according to claim 1, wherein, the step of disposing a source electrode layer and a drain electrode layer on the semiconductor layer further includes:
   disposing a metal layer on the semiconductor layer through a physical vapor deposition method; and
   performing a lithography process, an etching process and a film removing process in order to form the source electrode layer and the drain electrode layer, wherein, a contact region between the source electrode layer and the semiconductor layer and a contact region between the drain electrode layer and the semiconductor layer are respectively corresponding to the two thin regions.

7. A thin-film-transistor (TFT) switch, comprising:
   a substrate;
   a gate electrode layer disposed on the substrate, wherein, the gate electrode layer includes a middle region and side regions respectively located at two sides of the middle region, wherein at least a portion of each side region is thinned along a thickness direction of the gate electrode layer in order to form two thin regions, and a thickness of each thin region is less than a thickness of the middle region;
   a semiconductor layer disposed above the gate electrode layer; and
   a source electrode layer and a drain electrode layer disposed on the semiconductor layer, wherein, a contact region between the source electrode layer and the semiconductor layer, and a contact region between the drain electrode layer and the semiconductor layer are respectively corresponding to the two thin regions such that lights of a backlight source can irradiate the semiconductor layer after passing through the thin regions so that an ohmic contact is formed between the semiconductor layer and the source electrode layer and between the semiconductor layer and the drain electrode layer.

8. The TFT switch according to claim 7, wherein, the TFT switch further includes: a gate insulation layer disposed between the gate electrode layer and the semiconductor layer.

9. The TFT switch according to claim 7, wherein, a material of the semiconductor layer is an indium gallium zinc oxide compound.

10. A thin-film-transistor (TFT) substrate, wherein the TFT substrate includes a TFT switch, and the TFT switch includes:
    a substrate;
    a gate electrode layer disposed on the substrate, wherein, the gate electrode layer includes a middle region and side regions respectively located at two sides of the middle region, wherein at least a portion of each side region is thinned along a thickness direction of the gate electrode layer in order to form two thin regions, and a thickness of each thin region is less than a thickness of the middle region;
    a semiconductor layer disposed above the gate electrode layer; and
    a source electrode layer and a drain electrode layer disposed on the semiconductor layer, wherein, a contact region between the source electrode layer and the semiconductor layer, and a contact region between the drain electrode layer and the semiconductor layer are respectively corresponding to the two thin regions such that lights of a backlight source can irradiate the semiconductor layer after passing through the thin regions so that an ohmic contact is formed between the semiconductor layer and the source electrode layer and between the semiconductor layer and the drain electrode layer.

11. The TFT substrate according to claim 10, wherein, the TFT switch further includes: a gate insulation layer disposed between the gate electrode layer and the semiconductor layer.

12. The TFT substrate according to claim 10, wherein, a material of the semiconductor layer is an indium gallium zinc oxide compound.

* * * * *